United States Patent
Camponeschi et al.

(10) Patent No.: US 11,996,814 B2
(45) Date of Patent: May 28, 2024

(54) ACTIVE FILTER CONFIGURED TO SUPPRESS OUT-OF-BAND PEAKING AND AN ANALOG-TO-DIGITAL CONVERTER USING THE SAME

(71) Applicant: Intel Corporation, Santa Clara, CA (US)

(72) Inventors: Matteo Camponeschi, Villach (AT); Lukas Doerrer, Villach (AT); Patrick Torta, Villach (AT)

(73) Assignee: Intel Corporation, Santa Clara, CA (US)

( * ) Notice: Subject to any disclaimer, the term of this patent is extended or adjusted under 35 U.S.C. 154(b) by 485 days.

(21) Appl. No.: 17/059,491

(22) PCT Filed: Aug. 5, 2019

(86) PCT No.: PCT/US2019/045047
§ 371 (c)(1),
(2) Date: Nov. 30, 2020

(87) PCT Pub. No.: WO2020/050937
PCT Pub. Date: Mar. 12, 2020

(65) Prior Publication Data
US 2021/0265981 A1    Aug. 26, 2021

(30) Foreign Application Priority Data

Sep. 7, 2018   (DE) .......................... 102018121895.8

(51) Int. Cl.
*H03H 11/12* (2006.01)
*H03H 7/38* (2006.01)
*H03M 3/00* (2006.01)

(52) U.S. Cl.
CPC .......... *H03H 11/1286* (2013.01); *H03H 7/38* (2013.01); *H03M 3/424* (2013.01); *H03M 3/438* (2013.01); *H03M 3/458* (2013.01)

(58) Field of Classification Search
CPC ...... H03H 11/1286; H03H 7/38; H03H 3/424; H03H 3/438; H03H 3/458; H03H 11/1291;
(Continued)

(56) References Cited

U.S. PATENT DOCUMENTS

2008/0309535 A1   12/2008   Le Guillou
2010/0085230 A1    4/2010   Son
(Continued)

OTHER PUBLICATIONS

"Single-supply, 2nd-order, Sallen-Key low-pass filter circuit." Texas Instruments Incorporated, Jun. 2021 (Year: 2021).*
(Continued)

*Primary Examiner* — Lincoln D Donovan
*Assistant Examiner* — Tyler J Pereny
(74) *Attorney, Agent, or Firm* — 2SPL Patent Attorneys PartG mbB; Yong Beom Hwang

(57) ABSTRACT

An active filter and an analog-to-digital converter (ADC) configured to suppress out-of-band peaking. An active filter may include an active device configured to provide a power gain to an input signal, a feedback network configured to connect an output of the active device to an input of the active device, and an input impedance network configured to couple the input signal to the input of the active device. A combination of the feedback network and the input impedance network is configured to provide frequency response properties of the active filter such that a frequency domain signal transfer function of the active filter has a constant in numerator.

18 Claims, 14 Drawing Sheets

(58) Field of Classification Search
CPC .............. H03H 11/126; H03H 11/1204; H03F 2200/331; H03F 2203/45116; H03F 3/45; H03M 3/458; H03M 3/438; H03M 3/30; H03M 3/454; H03M 3/464; H03M 3/394
See application file for complete search history.

(56) References Cited

U.S. PATENT DOCUMENTS

| | | | |
|---|---|---|---|
| 2014/0266828 A1* | 9/2014 | Matsukawa | H03H 7/0138 333/172 |
| 2015/0194979 A1 | 7/2015 | Jiang et al. | |
| 2015/0341046 A1 | 11/2015 | Schinkel et al. | |
| 2016/0056835 A1 | 2/2016 | Hung et al. | |
| 2017/0207796 A1* | 7/2017 | Cho | H03M 3/43 |

OTHER PUBLICATIONS

Lucien Breems et al.: "A 2.2 GHz Continuous-Time ΣΔ ADC With-102 dBc THD and 25 MHz Bandwidth" IEEE Journal of Solid-State Circuits, vol. 51, No. 12, Dec. 2016, pp. 2906-2916.
Kazuo Matsukawa et al.: "A Fifth-Order Continuous-Time Delta-Sigma Modulator With Single-Opamp Resonator", IEEE Journal of Solid-State Circuits, vol. 45, No. 4, Apr. 2010, pp. 697-706.
Sebastian Zeller et a.: "A 9th-Order Continuous Time ΣΔ-ADC with X-Coupled Differential Single-Opamp Resonators", 978-1-61284-857-0/11/, © 2011 IEEE.
Sebastian Zeller et al.: "A X-Coupled Differential Single-Opamp Resonator for Low Power Continuous Time ΣΔ- ADCs", pp. 233-236, 978-1-4244-9137-7/11, © 2011 IEEE.

* cited by examiner

US 11,996,814 B2

ACTIVE FILTER CONFIGURED TO SUPPRESS OUT-OF-BAND PEAKING AND AN ANALOG-TO-DIGITAL CONVERTER USING THE SAME

RELATED APPLICATIONS

This application claims the benefit of priority to German Patent Application No. 10 2018 121 895.8 filed on Sep. 7, 2018, which is incorporated herein by reference in its entirety as if fully set forth.

FIELD

Examples relate to an active filter and an analog-to-digital converter (ADC), more particularly an active filter and a sigma delta ADC (SD-ADC) configured to suppress out-of-band peaking.

BACKGROUND

An ADC is one of key components of a transceiver. A sigma delta ADC is one type of ADC that is widely used in a transceiver. Transceivers for wireless applications, such as Fifth Generation (5G), Long Term Evolution (LTE), etc., require low power circuitries including the ADC.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are disclosed for an active filter, for example, a second order filter with a single amplifier, or any higher order filter. The example active filter may include a single amplifier so that a power consumption can be minimized. Examples are disclosed for an active filter topology that can avoid peaking in the signal transfer function.

Figure 1:
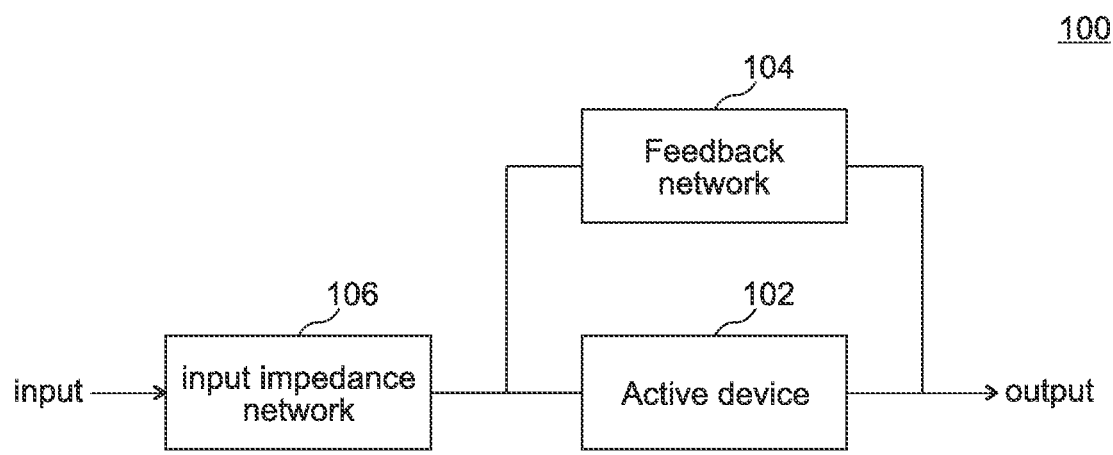
FIG. 1 is a schematic diagram of an example active filter in accordance with one example.

FIG. 1 is a schematic diagram of an example active filter 100 in accordance with one example. The active filter 100 may include an active device 102, a feedback network 104, and an input impedance network 106. While passive filters are built from passive components such as resistors, capacitors and inductors, active filters use active devices in addition to passive components such as resistors and capacitors. The active device 102 is configured to provide a power gain to an input signal. The active device 102 may be an operational amplifier, an operational transconductance amplifier (OTA), or any type of amplifier.

The feedback network 104 is configured to connect an output of the active device 102 to an input of the active device 102. The input impedance network 106 is configured to couple an input signal to the input of the active device 102. The feedback network 104 and the input impedance network 106 may include passive device(s) such as a resistor or a capacitor or a parallel or serial combination of a resistor and a capacitor.

The transfer function of the active filter 100 is defined by the ratio of the output signal and the input signal of the active filter 100. A combination of the feedback network 104 and the input impedance network 106 is configured to provide frequency response properties (e.g. the transfer function) of the active filter 100. In examples, the input impedance network and the feedback network are configured such that a frequency domain signal transfer function of the active filter 100 has a constant in numerator. In examples, the input impedance network 106 may compensate an impedance of the feedback network 104 so that an out-of-band peaking in a signal transfer function of the active filter 100 may be suppressed or eliminated. With the examples, the active filter 100 can minimize power consumption while suppressing or eliminating the out-of-band peaking and can increase the filter order.

The active filter 100 may be a second order filter, a third order filter, or any higher order filter. A third or higher order filter may be built by cascading the active filters 100 or by adding, in front or after, an additional active device(s) and/or resistor-capacitor network(s), etc. to the active filter(s) 100. The additional device or network may include passive device(s) such as a resistor or a capacitor or a parallel or serial combination of a resistor and a capacitor. The passive devices may be tunable by programming in order to control a variable filter cutoff frequency.

The active device 102 may be a differential amplifier or a single-ended amplifier. For example, the active device 102 may be a differential amplifier configured for single-ended operation. The input(s) and output(s) of the active filter 100 may be differential or single-ended. The active device 102 may be an inverting amplifier.

In examples, the number of active devices 102 used in the active filter 100 may be lower than the order of the active filter 100.

In examples, the feedback network 104 may include a parallel resistor-capacitor network coupling an output of the active device 102 to an input of the active device 102, and a series resistor-capacitor network coupling an inverse of the output of the active device 102 to the input of the active device 102.

In examples, the input impedance network 106 may include a resistor path connecting an input signal to the input of the active device 102 and a resistor-capacitor path coupled to the resistor path in parallel and connecting an inverse of the input signal to the input of the active device 102.

In examples, the input impedance network may have a linear s-polynomial in a numerator of an s-domain impedance of the input impedance network.

In examples, the active device 102 may be a differential amplifier and the feedback network 104 may include two parallel resistor-capacitor networks, each coupling one of differential outputs of the active device 102 to a differential input of opposite polarity of the active device 102, and two series resistor-capacitor networks, each coupling one of the differential outputs of the active device 102 to a differential input of same polarity of the active device 102.

In examples, the input impedance network 106 may include two sets of parallel resistor and resistor-capacitor networks, each set coupling one of differential input signals to differential inputs of the active device 102.

In examples, the input impedance network 106 may include two sets of parallel resistor-resistor and resistor-capacitor networks, each coupling one of differential input signals to differential inputs of the active device 102.

In examples, the active device may be an operational amplifier or an operational transconductance amplifier.

In examples, the active filter 100 may be included in a sigma delta analog-to-digital converter that may include a loop filter(s), a quantizer(s), and a digital-to-analog converter.

The active filter 100 may be included in any device for filtering an input analog signal. For example, the active filter 100 may be used as a loop filter in a sigma delta ADC. It should be noted that examples will be explained with respect to an ADC (e.g. a sigma delta ADC) but the examples are applicable to any applications.

Figure 2:
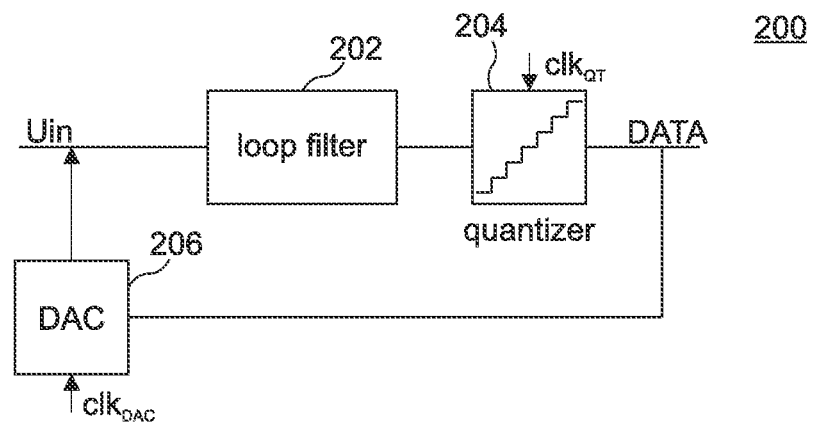
FIG. 2 is a block diagram of an example sigma delta ADC.

FIG. 2 is a block diagram of an example sigma delta ADC 200. A sigma delta ADC 200 is widely used in wireless communication receivers, etc. The sigma delta ADC 200 includes a loop filter 202, a quantizer 204, and a feedback digital-to-analog converter (DAC) 206. The input analog signal is filtered by the loop filter 202. The output from the loop filter 202 is converted to a digital signal by the quantizer 204 (e.g. a flash quantizer, a successive approximation register (SAR) ADC, a pipeline ADC, a voltage-controlled oscillator (VCO) time-to-digital conversion ADC, a MASH cascaded sigma delta ADC, etc.). The digital output from the quantizer 204 is provided to the feedback DAC 206 that converts the feedback digital signal to an analog signal which is subtracted from the analog input signal.

The active filter 100 of FIG. 1 may be used as the loop filter 202 in the sigma-delta ADC 200. The loop filter 202 is an analog filter including an active device, for example, an operational amplifier, an operational conductance amplifier, etc. The filter properties, such as corner frequency, order, or stop and passband range, etc. are defined by the values of passive devices (resistors, capacitors, etc.) and an active device(s) of the active filter.

The number of operational amplifiers may define the order of the loop filter 202 and hence the dynamic range of the ADC 200. Due to the blocker robustness, approximately ⅔ of the ADC power may be consumed by the operational amplifiers (or OTAs) of the ADC loop filter 202. With high order loop filters, sigma-delta ADCs with high dynamic range can be built, but they consume a lot of power bound to the number of active devices.

The higher the filter order, the greater the selectivity of the filter. To achieve a certain filter selectivity, a loop filter with a certain filter order may be used. When employing a loop filter, the number of active devices in the loop filter may be increased as the filter order. Since each active device consumes power, the power consumption of the ADC is increased with the order of the loop filter.

Figure 3:
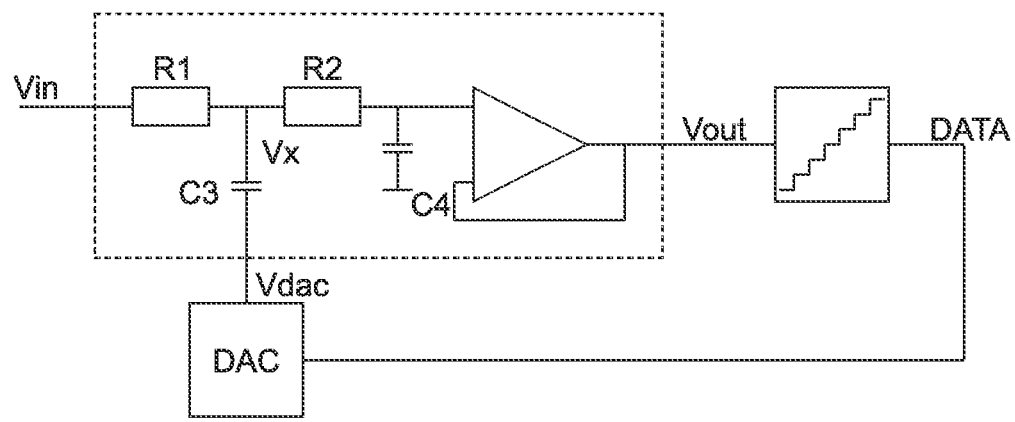
FIG. 3 shows a Sallen and Key filter using a quantizer and a digital-to-analog converter (DAC) in the feedback.
Figure 4:
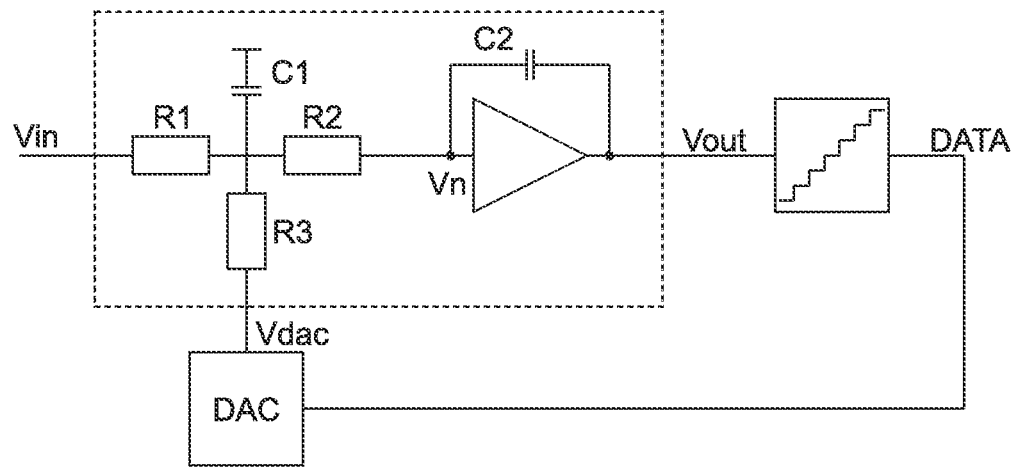
FIG. 4 shows a multiple feedback filter using a quantizer and a DAC in the feedback.

To lower the number of active amplifiers in the loop filter, a second order filter with a single operational amplifier may be built. For example, a Sallen and Key filter shown in FIG. 3 or a multiple feedback filter shown in FIG. 4 may be employed as the loop filter 202. However, the filters shown in FIGS. 3 and 4 have disadvantages in using in a sigma delta ADC 200.

The loop filter 202 needs to have certain properties for a sigma delta ADC. The signal transfer function (STF) of the loop filter 202, which is the transfer characteristics from the input signal path to the output of the quantizer 204, needs to have a low pass or a flat shape. The noise transfer function (NTF), which is the transfer characteristics from the input of the quantizer 204 to the output of the quantizer 204 in parallel to the feedback DAC 206 and the loop filter 202 and the quantizer 204, needs to be a high pass shape. An undamped filter resonator also needs to be possible to improve the filter behavior. However, the filters shown in FIGS. 3 and 4 do not have one or more of the above properties.

Figure 5:
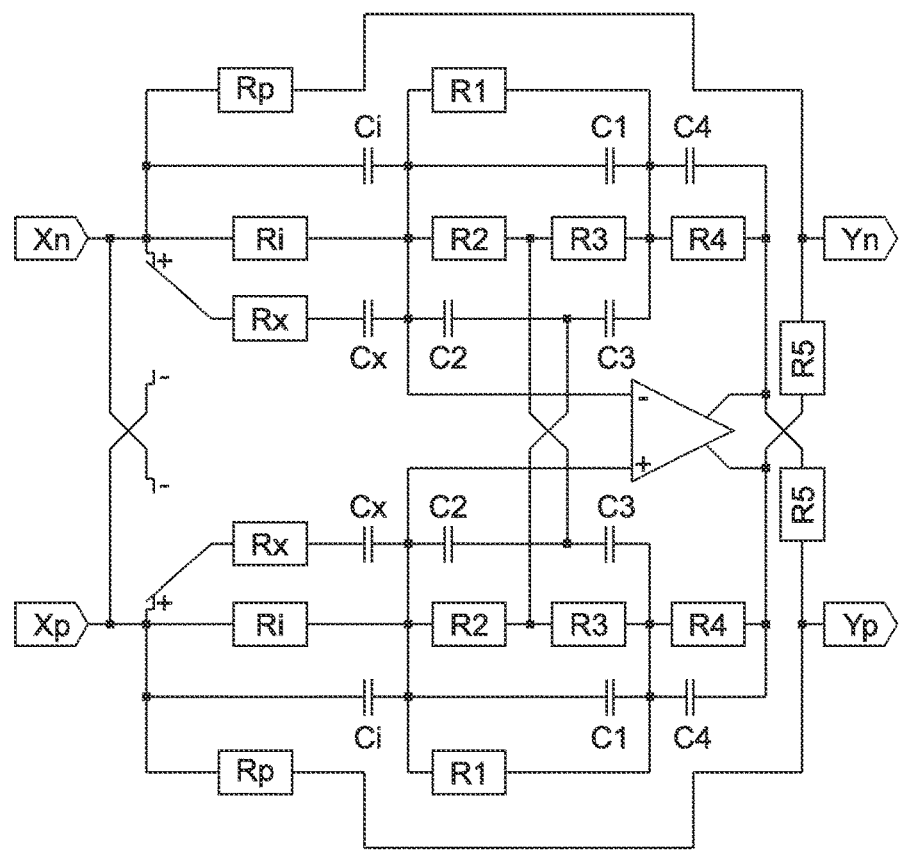
FIG. 5 shows a filter with a generic X-coupled resonator with a second order numerator polynomial.
Figure 6:
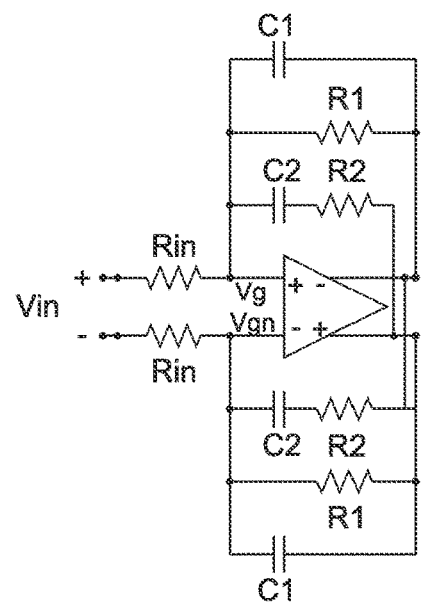
FIG. 6 shows a second order single operational amplifier loop filter.
Figure 7:
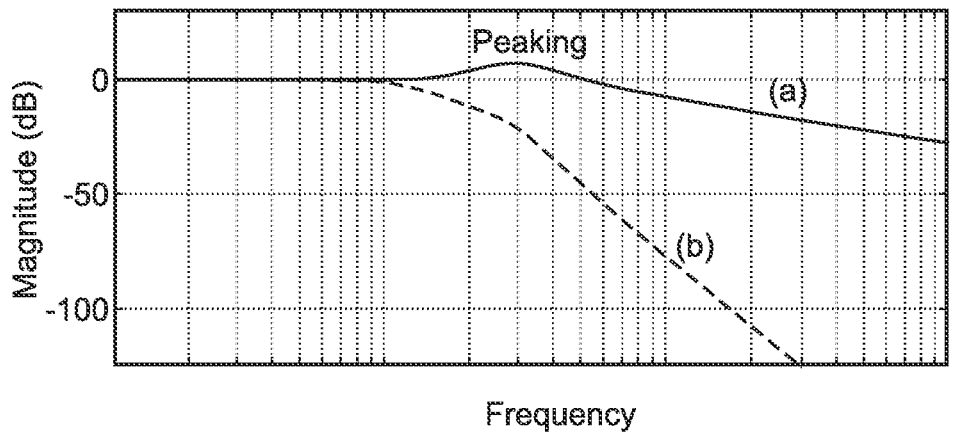
FIG. 7 shows a signal transfer function of a filter with out-of-band peaking and without out-of-band peaking.

FIGS. 5 and 6 show some example loop filter design that may have some of the above-described properties for a sigma-delta loop filter. However, the topologies shown in FIGS. 5 and 6 also have some disadvantages. The filter transfer function of the filters in FIGS. 5 and 6 does not have a flat STF. The plot (a) in FIG. 7 shows the STF of an SD-ADC implementing in the filter design in FIG. 5 or 6, and the plot (b) in FIG. 7 shows an example STF without peaking that would be obtained in accordance with the examples disclosed herein. As shown in FIG. 7 (the plot (a)), at out of band, where a blocker signal (e.g. an interference signal or an unwanted signal) may occur, there is a peaking (overshoot) in the transfer function. At this frequency, the unwanted blocker signal is not attenuated, but is amplified. This peaking would require to extend the dynamic range of the ADC. In order to overcome overload at full scale at this frequency, a more aggressive pre-filter at the input of the ADC needs to be designed, but it increases the power and area of a receiver chain.

Examples are disclosed for an active filter for a sigma delta ADC or other applications that can minimize power consumption while suppressing or eliminating the out-of-band peaking.

In one example, a low power second order single amplifier filter having a low pass STF without peaking in the transfer function is disclosed. As stated above, the examples are not limited to a second order filter but may be extended to third, fourth, or any higher order filter by cascading the active filters or by adding additional active or passive device(s) or network(s). A peaking may occur if the s-domain numerator term of the STF of the filter is a function of the complex frequency. The s-domain is a complex domain on which the functions are converted by Laplace transforms. It is a mathematical domain where, instead of viewing signals in the time domain modeled with time-based functions, the signals are viewed in the frequency domain. Equation (1) is an STF that may generate peaking, while Equation (2) is an STF that may not generate peaking.

$$STF = k_0 \cdot \frac{\frac{s^{n-1}}{\omega_{zn-1}} + \ldots + \frac{s^1}{\omega_{z2}} + \frac{s}{\omega_{z1}} + 1}{\frac{s^n}{\omega_{pn}} + \frac{s^{n-1}}{\omega_{pn-1}} + \ldots + \frac{s^2}{\omega_{p2}} + \frac{s^1}{\omega_{p1}} + 1}, \quad \text{Equation (1)}$$

$$STF = k_0 \cdot \frac{1}{\frac{s^n}{\omega_{pn}} + \frac{s^{n-1}}{\omega_{pn-1}} + \ldots + \frac{s^2}{\omega_{p2}} + \frac{s^1}{\omega_{p1}} + 1}, \quad \text{Equation (2)}$$

where $s=j\omega=j2\pi f$. In Equation (1), peaking may occur because the numerator is not constant. In Equation (2), peaking may not occur because the numerator is constant.

Figure 8A:
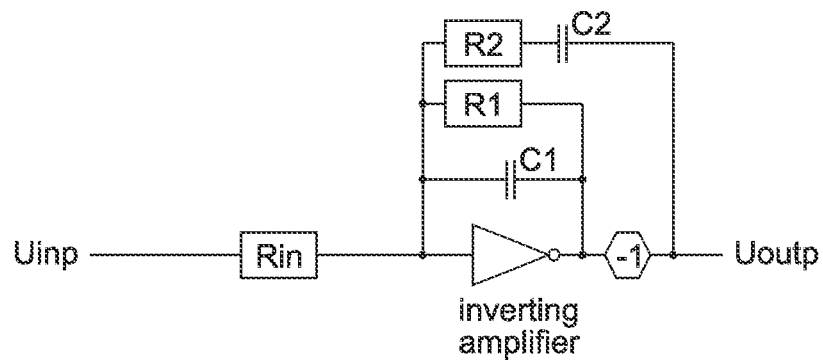
FIG. 8A shows an example second order single amplifier active filter that may generate peaking.
Figure 8B:
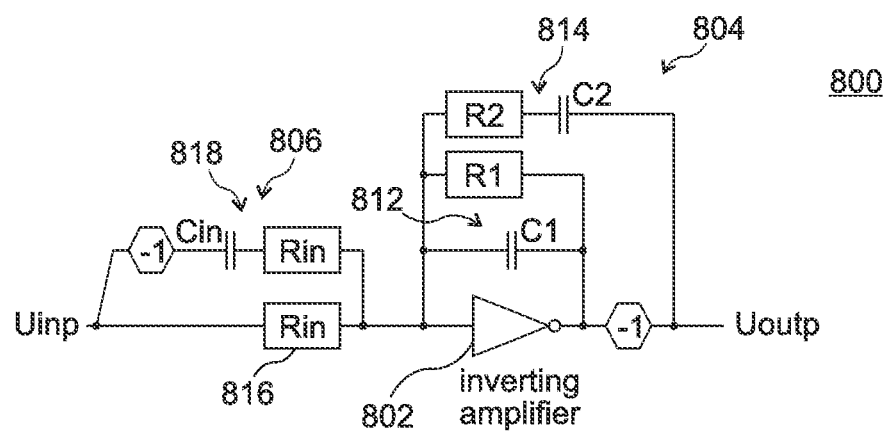
FIG. 8B-8E shows an example second order single amplifier active filter that may not generate peaking in accordance with some examples.

FIG. 8A shows an example second order single amplifier active filter that may generate peaking. FIG. 8B shows an example second order single amplifier active filter that may not generate peaking in accordance with one example. Equation (3) is a signal transfer function of a filter that may generate peaking (e.g. the filter in FIG. 8A where n=2).

$$STF = k_0 \cdot \frac{\frac{s}{\omega_{z1}} + 1}{\frac{s^n}{\omega_{pn}} + \frac{s^{n-1}}{\omega_{pn-1}} + \ldots + \frac{s^2}{\omega_{p2}} + \frac{s^1}{\omega_{p1}} + 1}. \quad \text{Equation (3)}$$

In examples, the input impedance network and the feedback network are configured such that a frequency domain signal transfer function of an active filter has a constant in numerator. In order to compensate peaking, an STF of an active filter may be multiplied with the inverse of the STF numerator to make a constant STF numerator.

Equation (4) shows multiplying the inverse of the STF numerator to the STF to make the numerator constant. After the multiplication in Equation (4), the resulting STF will be the same as in Equation (2), which may not generate peaking.

$$STF = \frac{k_0}{\frac{s}{\omega_{z1}} + 1} \cdot \frac{\frac{s}{\omega_{z1}} + 1}{\frac{s^n}{\omega_{pn}} + \frac{s^{n-1}}{\omega_{pn-1}} + \ldots + \frac{s^2}{\omega_{p2}} + \frac{s^1}{\omega_{p1}} + 1}. \quad \text{Equation (4)}$$

With this scheme, a peaking in a signal transfer function of the active filter may be suppressed or eliminated and the active filter can minimize power consumption while suppressing the out-of-band peaking.

Referring to FIG. 8B, in one example, the active filter 800 includes an active device 802, a feedback network 804, and an input impedance network 806. The active filter 800 in FIG. 8B shows a single-ended configuration, as an example, and may be configured in a differential structure as stated above. For example, the active device 802 may be an inverting amplifier, an operational amplifier, an operational transconductance amplifier, or any other type of amplifier. The active filter 800 may be used as a loop filter 202 in a sigma delta ADC 200 or any other device.

The feedback network 804 connects the output of the active device 802 to the input of the active device 802. The feedback network 804 includes a parallel resistor-capacitor network 812 (R1 and C1) and a series resistor-capacitor network 814 (R2 and C2). The parallel resistor-capacitor network 812 includes a resistor and a capacitor connected in parallel. The series resistor-capacitor network 814 includes a resistor and a capacitor connected in series. The parallel resistor-capacitor network 812 connects the output of the active device 802 to the input of the active device 802, and the series resistor-capacitor network 814 connects an inverse of the output of the active device 802 to the input of the active device 802. In the example, the active filer 800 includes a series feedback branch 814 (R2+1/sC2) from the inverted output to the input of the active device 802 and an additional parallel feedback branch 812 (R1//(sC1)=R1/(R1sC1+1) from the output to the input of the active device 802.

The input impedance network 806 connects an input signal to an input of the active device 802. In the example, the input impedance network 816 may include a resistor path 806 connecting an input signal to the input of the active device 802 and a resistor-capacitor path 818 coupled to the resistor path 816 in parallel and connecting an inverse of the input signal to the input of the active device 802. From the input of the active filter 800 there is an impedance with linear polynomial in frequency in the numerator. For example, any impedance network with a high pass transfer function ($k_0 \times (s/\omega+1)$) may be used. In the example configuration shown in FIG. 8B, the serial feedback impedance (R2+1/sC2) in the feedback network 804 is compensated by a complex input impedance $Z_{in}$. The time constant of the serial feedback branch (R2×C2) may be equal to the input impedance $R_{in} \times C_{in}$. Generally, any input impedance network with impedance $Z_{in}$, which contains a linear s-polynomial in the numerator may be used to compensate the peaking of the STF in this example. In the example of FIG. 8B, the input impedance is as follows:

$$Z_{in} = \frac{1}{\frac{1}{R_{in}} - \frac{1}{R_{in} + \frac{1}{sC_{in}}}} = R_{in}(s R_{in} C_{in} + 1) = R_{in}\left(\frac{s}{\omega_{in}} + 1\right).$$ Equation (4)

Figure 8C:
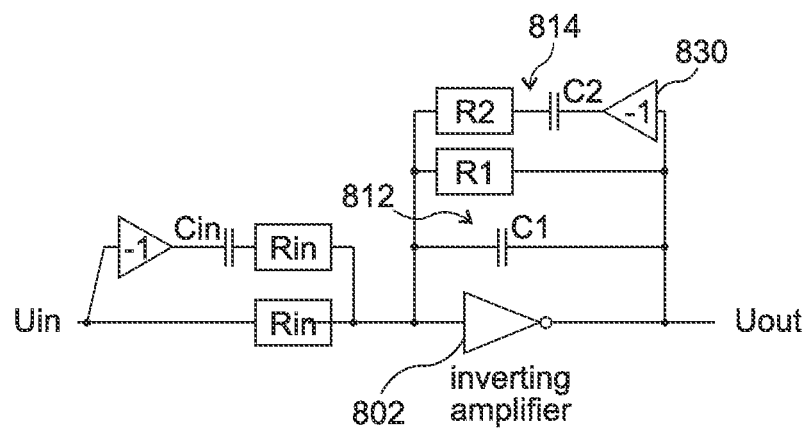
Figure 8D:
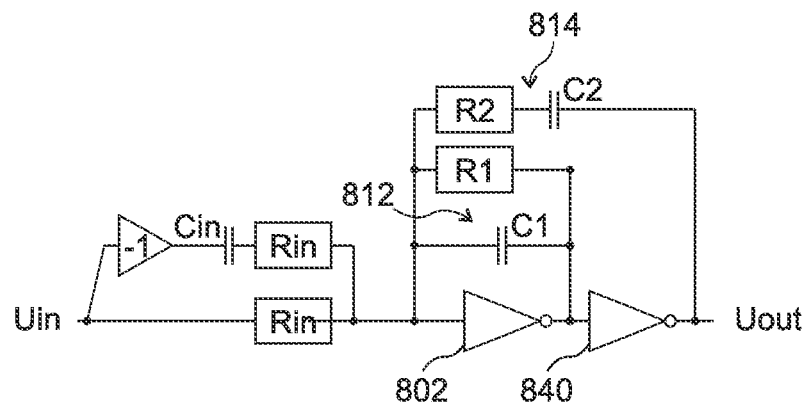
Figure 8E:
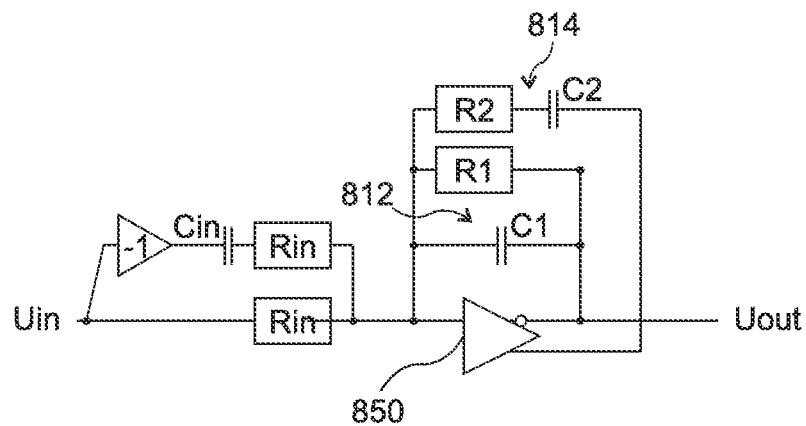

The "−1" sign in a hexagon in FIG. 8B and all other figures (e.g. FIGS. 11 and 16) and the "−1" sign in a triangle (e.g. in FIGS. 12-15) is to distinguish between positive and negative feedback or inputs. The active device 802 may be an inverting amplifier and the inverting amplifier output is coupled to the input of the active device 802 through the parallel resistor-capacitor network 812 and the inverse of the inverting amplifier output is coupled to the input of the active device 802 through the series resistor-capacitor network 814. It may be implemented with an inverter or by taking one of the signals in a differential structure, or the like. FIGS. 8C-8E show some examples. As shown in FIG. 8C, an inverter 830 may be inserted in the feedback loop (i.e. into the R2-C2 network 814) so that an inverse of the output of the active device 802 may be coupled to the input of the active device 802 through the series resistor-capacitor network 814 while the output of the active device 802 is coupled to the input of the active device 802 through the parallel resistor-capacitor network 812. Alternatively, as shown in FIG. 8D, an inverter 840 may be inserted after the active device 802 and the series resistor-capacitor network 814 is coupled to the output of the inverter 840 while the parallel resistor-capacitor network 812 is coupled to the output of the active device 802. Alternatively, an active device 850 generating differential outputs may be used. The parallel resistor-capacitor network 812 is coupled to the inverting output of the active device 850 and the series resistor-capacitor network 814 is coupled to the non-inverting output of the active device 850.

More details and aspects are mentioned in connection with the proposed concept or one or more examples described above or below. The active filter 800 may comprise one or more additional features corresponding to one or more aspects of the proposed concept or of one or more examples described above or below (e.g. FIGS. 9-19).

Figure 9:
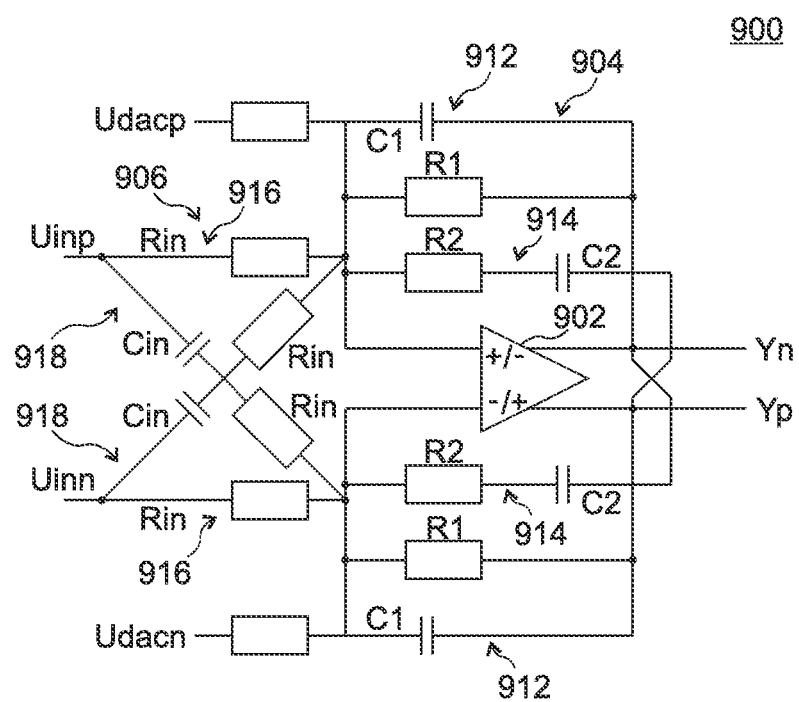
FIG. 9 shows a circuit topology of an active filter in accordance with one example.
Figure 10A:
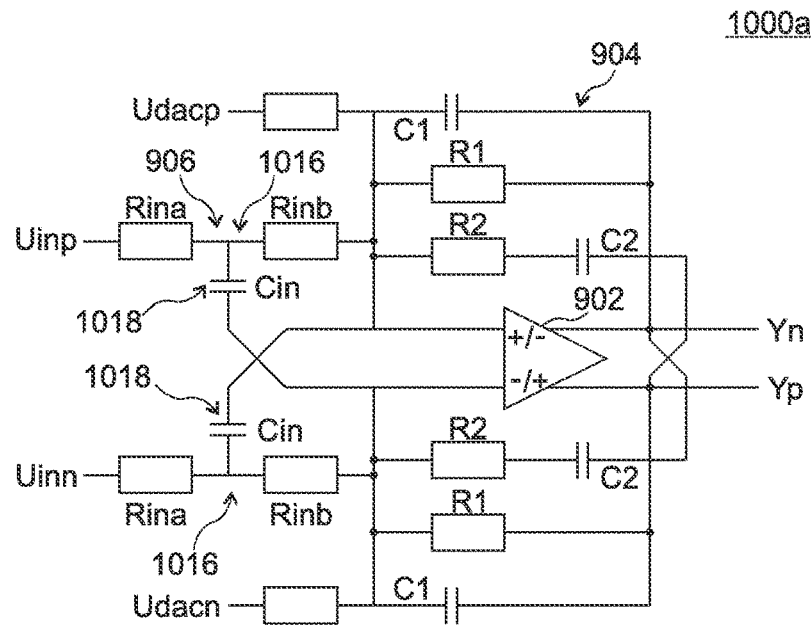
FIGS. 10A and 10B show alternative topologies of an active filter in accordance with some examples.
Figure 10B:
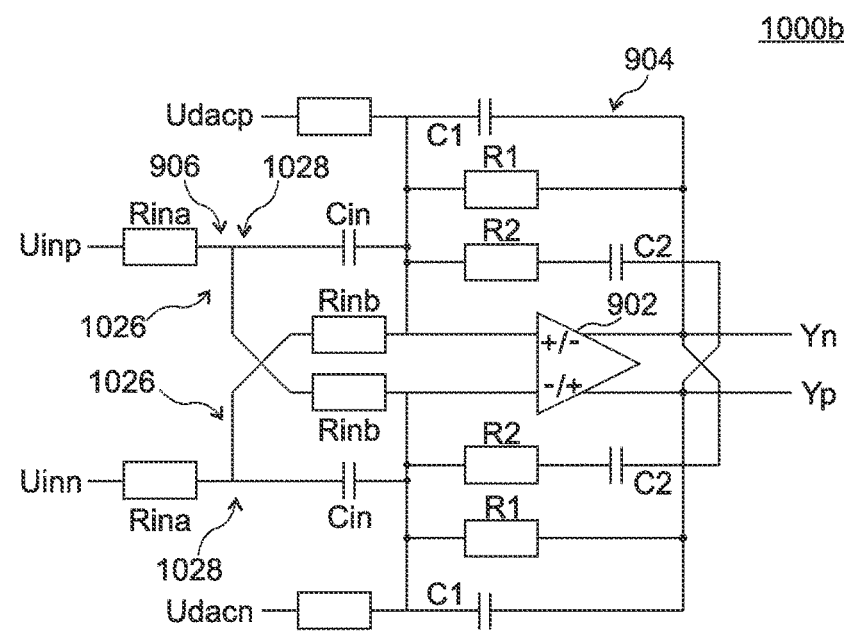

Examples of differential structure of an active filter are shown in FIGS. 9, 10A, and 10B.

FIG. 9 shows a circuit topology of an active filter 900 in accordance with one example for a flat STF with compensating circuitry at the input of the active filter 900. The active filter 900 includes an active device 902, a feedback network 904, and an input impedance network 906. The active device 902 may be a differential amplifier generating differential outputs. Alternatively, the active device 902 may output a single-ended output.

The feedback network 904 includes two parallel resistor-capacitor networks 912 (R1 and C1)) and two series resistor-capacitor networks 914 (R2 and C2). The parallel resistor-capacitor network 912 includes a resistor and a capacitor connected in parallel. The series resistor-capacitor network 914 includes a resistor and a capacitor connected in series. Each parallel resistor-capacitor network 912 couples one of differential outputs of the active device 902 to a differential input of inverted (or opposite) polarity of the active device 902 (e.g. couples a non-inverting output to an inverting input and couples an inverting output to a non-inverting input).

Each series resistor-capacitor network 914 couples one of differential outputs of the active device 902 to a differential input of same (or non-inverted) polarity of the active device 902 (e.g. couples a non-inverting output to a non-inverting input and couples an inverting output to an inverting input).

The input impedance network 906 includes two sets of resistor path 916 and series resistor-capacitor path 918 that are coupled in parallel. The resistor path 916 may include multiple resistors in series. The series resistor-capacitor path 918 may include a resistor and a capacitor connected in series. One or more resistor may be common in the resistor path 916 and the series resistor-capacitor path 918. The resistor path 916 couples one differential input signal to one of the differential inputs of the active device 902 (e.g. couples a positive input signal to a non-inverting input of the active device 902 and couples a negative input signal to an inverting input of the active device 902), and the series resistor-capacitor path 918 couples the same differential input signal to the other differential input of the active device 902 (e.g. couples a positive input signal to an inverting input of the active device 902 and couples a negative input signal to a non-inverting input of the active device 902).

More details and aspects are mentioned in connection with the proposed concept or one or more examples described above or below. The active filter 900 may comprise one or more additional features corresponding to one or more aspects of the proposed concept or of one or more examples described above (e.g. FIG. 8B) or below (e.g. FIGS. 10-19).

FIGS. 10A and 10B are alternative topologies of an active filter 1000a/1000b in accordance with some examples. The topologies of the active filter in FIGS. 10A and 10B are similar to the one in FIG. 9, and only the differences will be explained for simplicity.

In FIG. 10A, the input impedance network 906 includes a resistor path 1016 comprising multiple resistors connecting one differential input signal to one of differential inputs of the active device 902 directly, and a resistor-capacitor path 1018, comprising a resistor and a capacitor connected in series, cross-coupling the same differential signal to the other differential input of the active device 902.

In FIG. 10B, the input impedance network 906 includes a resistor path 1026 comprising multiple resistors cross-connecting one differential input signal to one of differential inputs of the active device 902, and a resistor-capacitor path 1028, comprising a resistor and a capacitor connected in series, directly coupling the same differential input signal to the other differential input of the active device 902.

More details and aspects are mentioned in connection with the proposed concept or one or more examples described above or below. The active filter 1000a/1000b may comprise one or more additional features corresponding to one or more aspects of the proposed concept or of one or more examples described above (e.g. FIGS. 8B, 9) or below (e.g. FIGS. 11-19).

It should be noted that the configuration shown in FIGS. 8B, 9, 10A, and 10B are merely provided as an example, and the topology of the active filter (including the input impedance network) may be configured differently.

Figure 11:
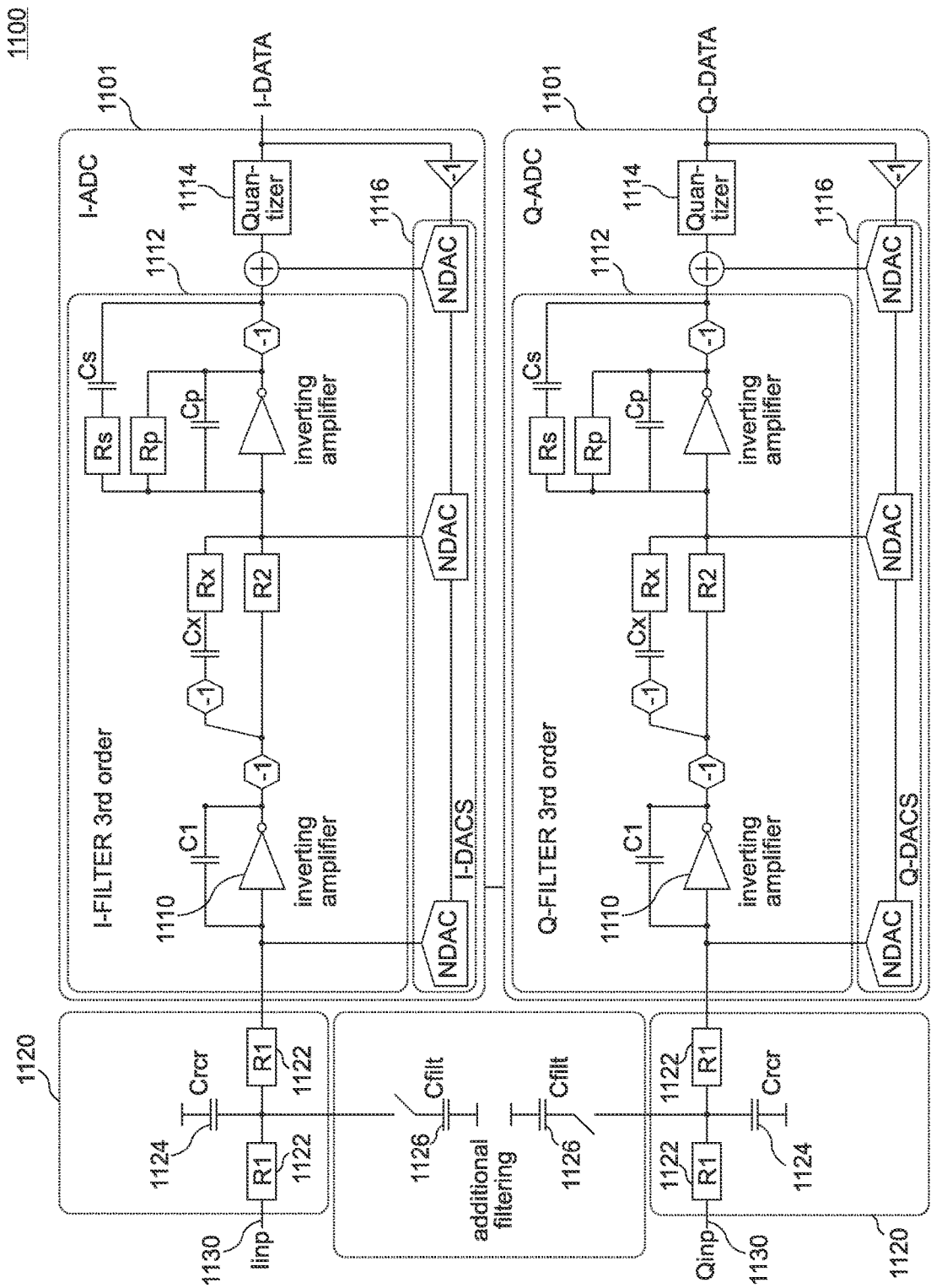
FIG. 11 shows an example sigma delta ADC including an active filter instantiated two times for the in-phase (I) and quadrature (Q) paths in accordance with one example.

FIG. 11 shows a device 1100 including an example sigma delta ADC 1101 (two ADCs for I and Q branches in parallel). One of example active filters disclosed herein is used in a loop filter 1112 of the sigma delta ADC 1101. The device 1100 includes in-phase/quadrature (I/Q) branches including the sigma delta ADC 1101. The sigma delta ADC 1101 includes a loop filter 1112, a quantizer 1114, and a DAC 1116. The loop filter 1112 shown in FIG. 11 is a third order filter implemented with additional active device 1110 and an active filter 1102 in accordance with one example. Alternatively, the loop filter 1112 may be a second order or any higher order filter. The input signal 1130 may be filtered by a filter (e.g. an RCR filter 1120) before entering into the loop filter 1112. As an example, the RCR filter 1120 for more filtering at a narrower bandwidth may include resistors 1122 in series and a capacitor 1124 connected between the resistors 1122 in parallel. An additional filter (e.g. a capacitor 1126) may be connected to the RCR filter 1120 to achieve additional filtering (e.g. for Global System for Mobile communication (GSM) applications, etc.). The input signal 1130 is filtered by the loop filter 1112 and then quantized by the quantizer 1114. The quantized output is fed back to the DAC 1116, converted to an analog signal, and then subtracted from the input signal 1130. The DAC 1116 may include multiple DACs and the feedback signal may be subtracted from the input signal at multiple stages. For example, the DAC is an N-bit DAC (e.g. N=4, 5, or any integer number). The N-bit DAC can be implemented in the current domain using a current steering DAC, in the voltage domain using a voltage driver connected to a resistor or alternatively using a capacitively coupled DAC with the inverting amplifier.

More details and aspects are mentioned in connection with the proposed concept or one or more examples described above or below. The device 1100 may comprise one or more additional features corresponding to one or more aspects of the proposed concept or of one or more examples described above (e.g. FIG. 8B-10B) or below (e.g. FIGS. 12-19).

Figure 12:
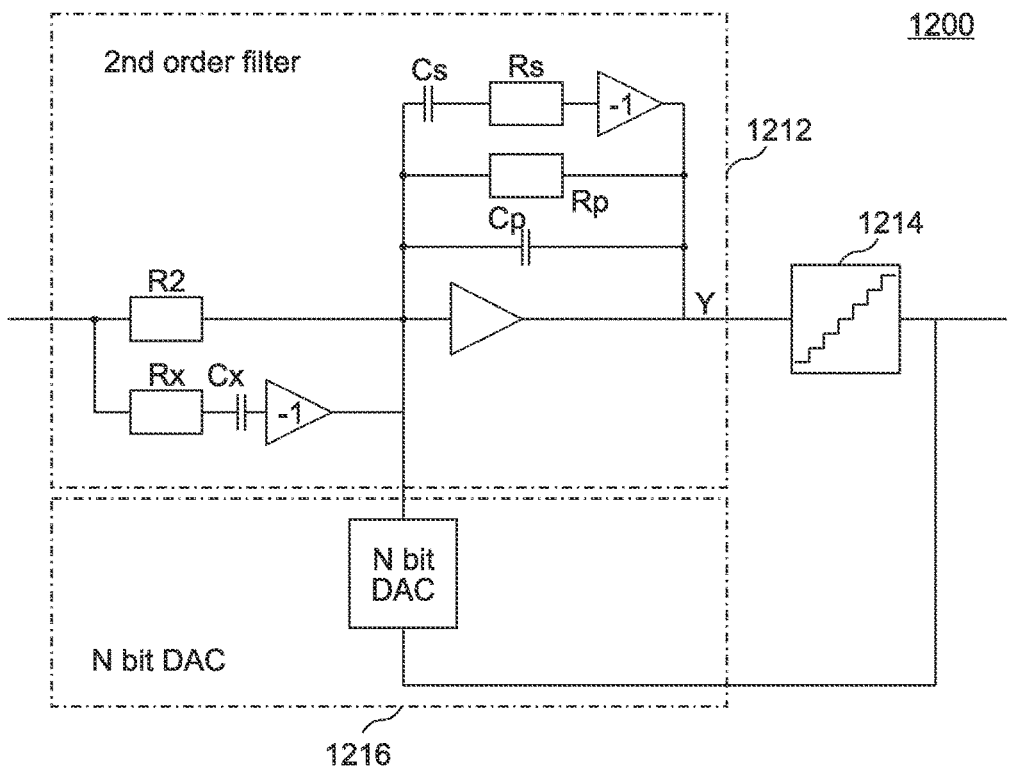
FIG. 12 shows an example sigma delta ADC with a second order filter.

FIG. 12 shows an example sigma delta ADC 1200 with a second order filter. The sigma delta ADC 1200 includes a loop filter 1212, a quantizer 1214, and a DAC 1216. The loop filter 1212 shown in FIG. 12 is a second order filter in accordance with one example. The DAC is an N-bit DAC.

Figure 13:
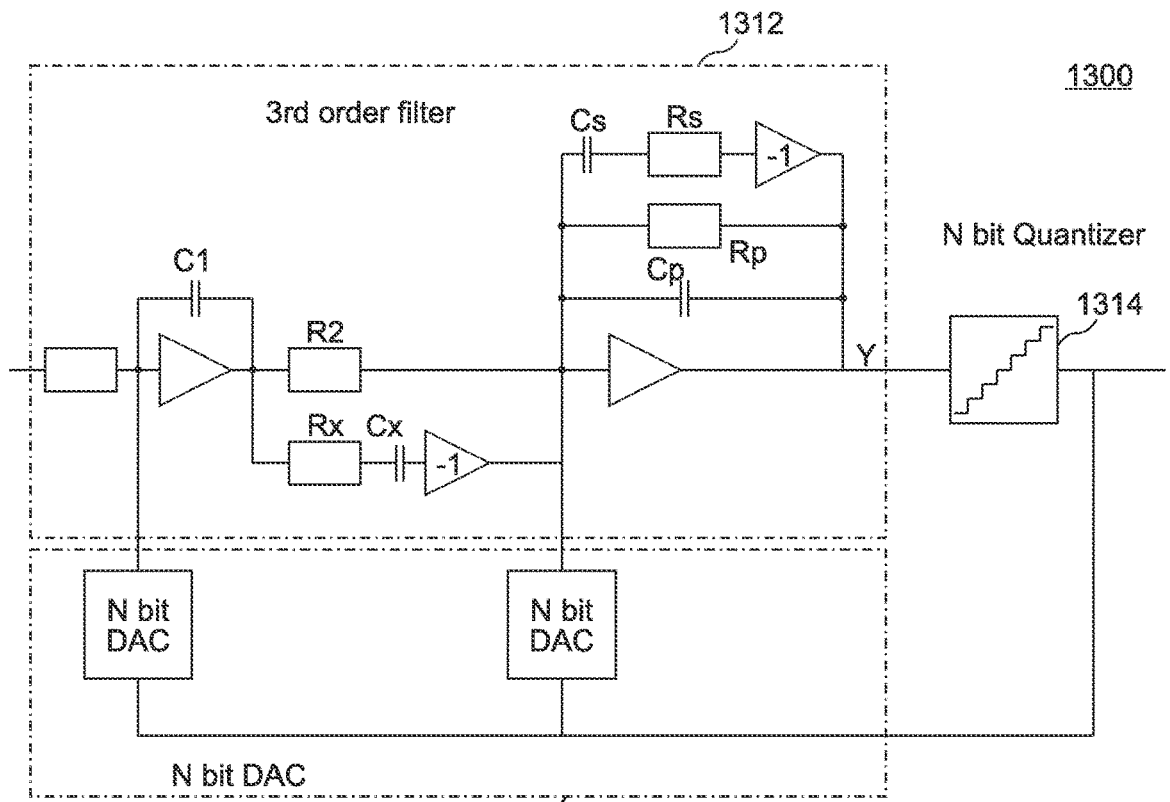
FIG. 13 shows another example sigma delta ADC with a third order filter.

FIG. 13 shows another example sigma delta ADC 1300 with a third order filter. The sigma delta ADC 1300 includes a loop filter 1312, a quantizer 1314, and a DAC 1316. The DAC is an N-bit DAC. One of the example active filters disclosed above may be used as the loop filter 1312.

Figure 14:
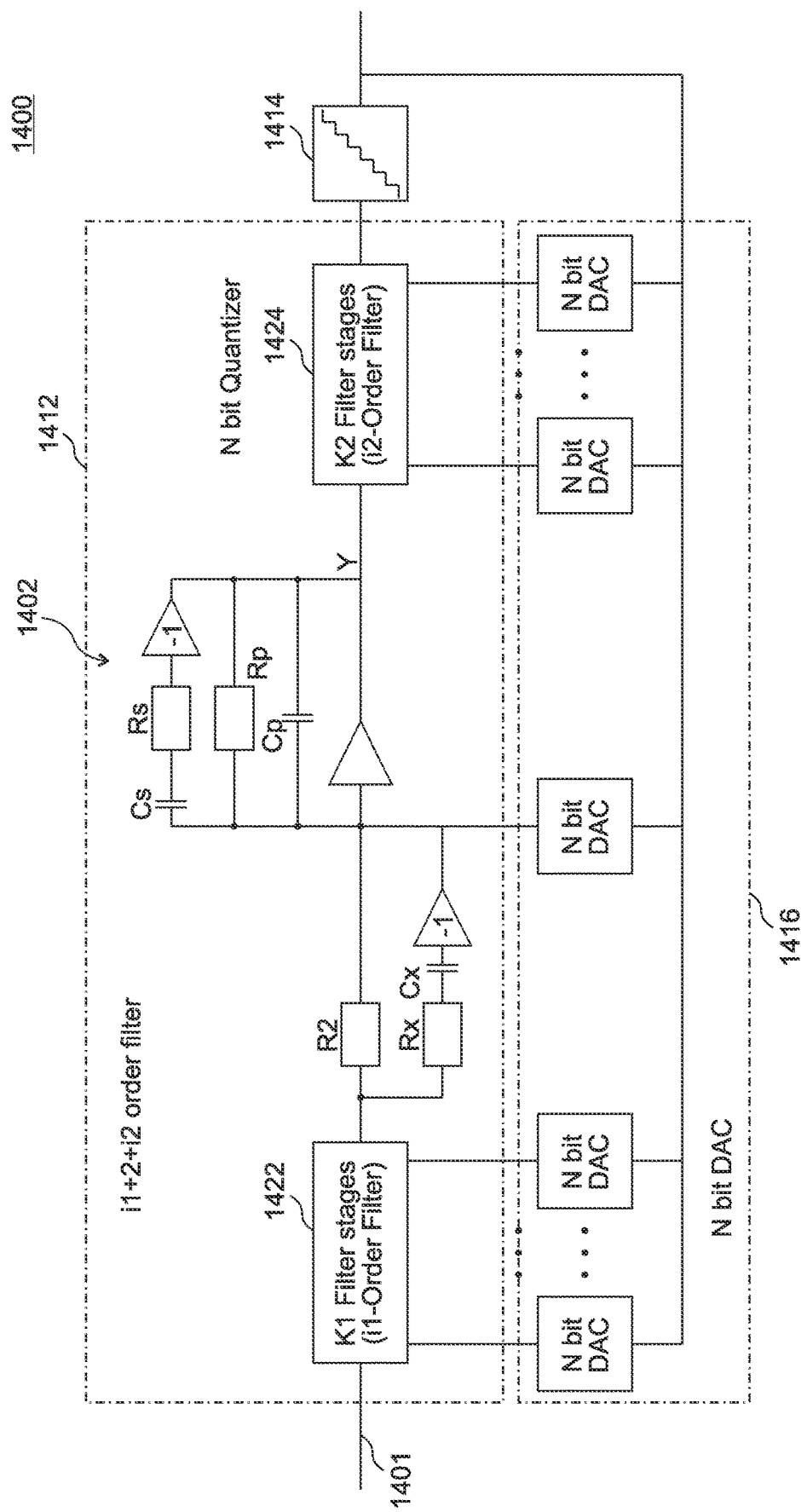
FIGS. 14 and 15 show another example sigma delta ADCs with a higher order filter.

FIG. 14 shows another example sigma delta ADC 1400 with a higher order filter. The sigma delta ADC 1400 includes a loop filter 1412, a quantizer 1414, and a DAC 1416. The loop filter 1412 is a (i1+2+i2)-th order filter implemented with the active filter 1402 in accordance with one of the example filters disclosed above and multi-stage filters 1422, 1424 added in front and/or after the active filter 1402, where i1 and i2 are any integer number. The input signal 1401 is filtered by the loop filter 1412 and then quantized by the quantizer 1414. The quantized output is fed back to the DAC 1416, converted to an analog signal, and then subtracted from the input signal 1401. The DAC 1416 may include multiple DACs and the feedback signal may be subtracted from the input signal 1401 at multiple stages.

Figure 15:
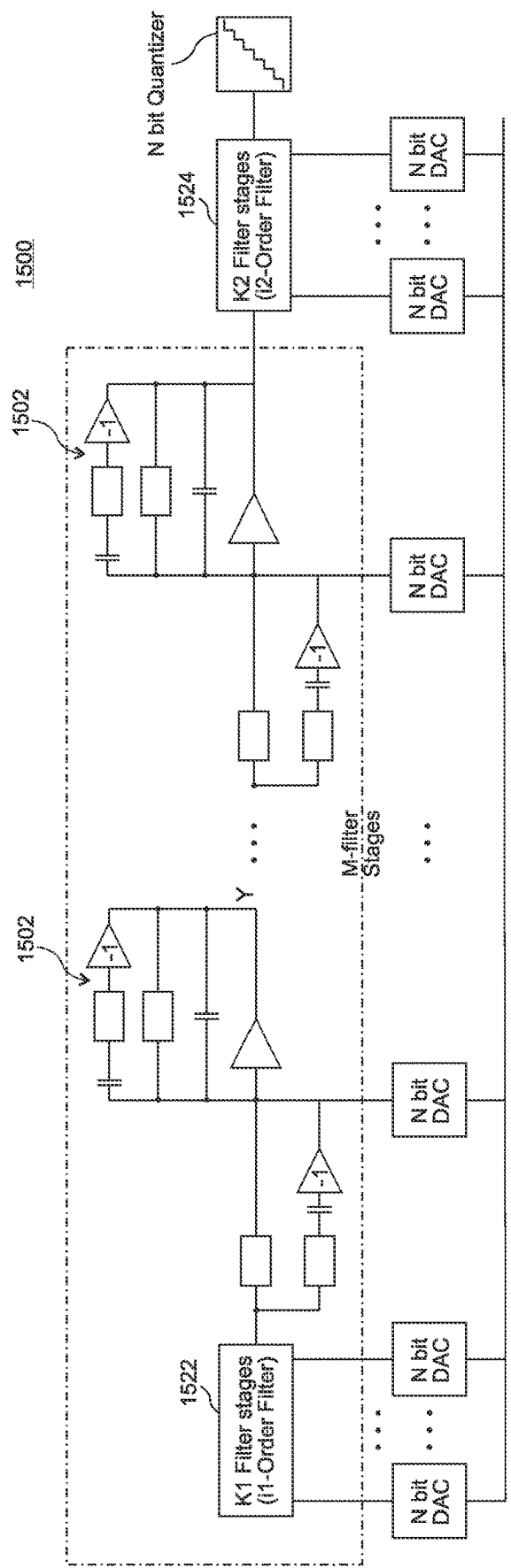

FIG. 15 shows another example sigma delta ADC 1500 with a higher order filter. The structure of the ADC 1500 is similar to the ADC 1400 in FIG. 14. In FIG. 15, the active filters 1502 in accordance with one example may be cascaded and multi-stage filters 1522, 1524 are added in front and/or after the active filters 1502 to build a higher order filter.

More details and aspects are mentioned in connection with the proposed concept or one or more examples described above or below. Each of the sigma delta ADCs 1200, 1300, 1400, 1500 may comprise one or more additional features corresponding to one or more aspects of the proposed concept or of one or more examples described above or below (e.g. FIGS. 8B-19).

Figure 16:
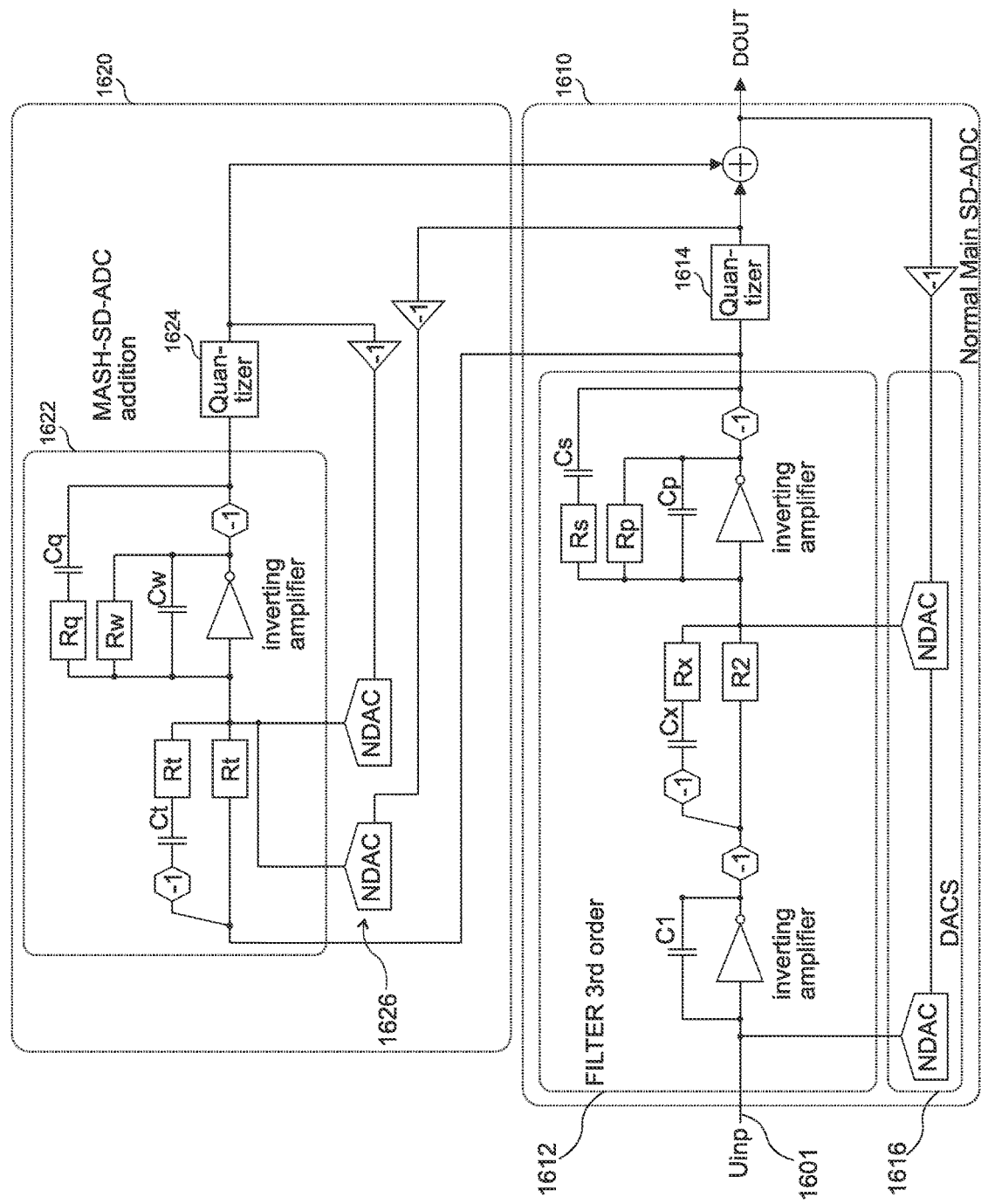
FIG. 16 shows an example sigma delta ADC implemented with a multi-stage noise shaping (MASH) network in accordance with one example.

FIG. 16 shows an example sigma delta ADC implemented with a multi-stage noise shaping (MASH) network in accordance with one example. The sigma delta ADC 1610 includes a loop filter 1612, a quantizer 1614, and a DAC 1616. The loop filter 1612 shown in this example is a third order filter as shown in FIG. 13, but may be in any order. The input signal is 1601 is filtered by the loop filter 1612 and then quantized by the quantizer 1614. The quantized output is fed back to the DAC 1616, converted to an analog signal, and then subtracted from the input signal 1601 in one or more stages. The MASH network 1620 may include a MASH filter 1622, a quantizer 1624, and a DAC(s) 1626. The MASH network 1620 taps the analog signal in front of the quantizer 1614. The MASH network also converts the digital signal output from the quantizer 1614 (or inverse of it) to an analog signal by the DAC 1626 and subtracts (or adds) it to generate a residual error. This residual error signal is then processed through the MASH filter 1622 and then quantized by the quantizer 1624 and added back to the output of the quantizer 1614 to achieve higher resolution. In this example, the filter structure for suppressing or eliminating an out-of-band peaking in accordance with the examples disclosed herein is used both in the loop filter 1612 and the MASH filter 1622.

In the disclosed examples, each passive device may be a single resistor, a single capacitor, a single inductor, or a parallel or series combination of the passive devices (e.g. resistor, capacitor, inductor) for filter frequency tuning or for different bandwidth modes.

Figure 17:
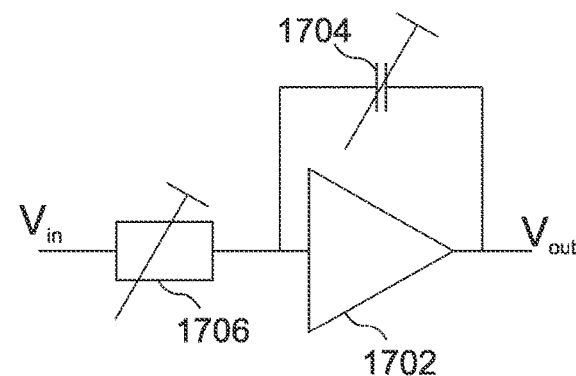
FIG. 17 shows an example filter with a feedback network and an input network having variable capacitance and resistance, respectively.

FIG. 17 shows an example filter with a feedback network having variable capacitance and an input network having variable resistance. The filter 1700 includes an active device 1702, a variable-capacitor feedback network 1704 and a variable-resistor input network 1706. The capacitance of the feedback network and the resistance of the input network may be varied for filter frequency tuning, different bandwidth modes, etc.

Figure 18:
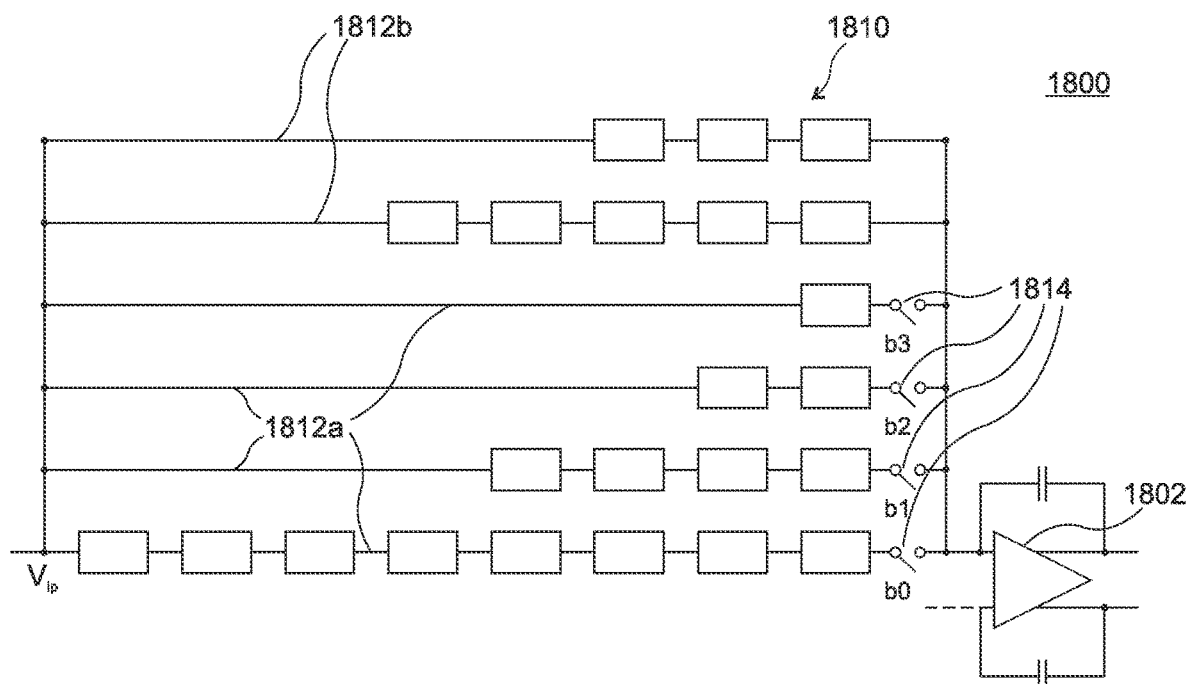
FIGS. 18 and 19 show some examples for resistance tuning.
Figure 19:
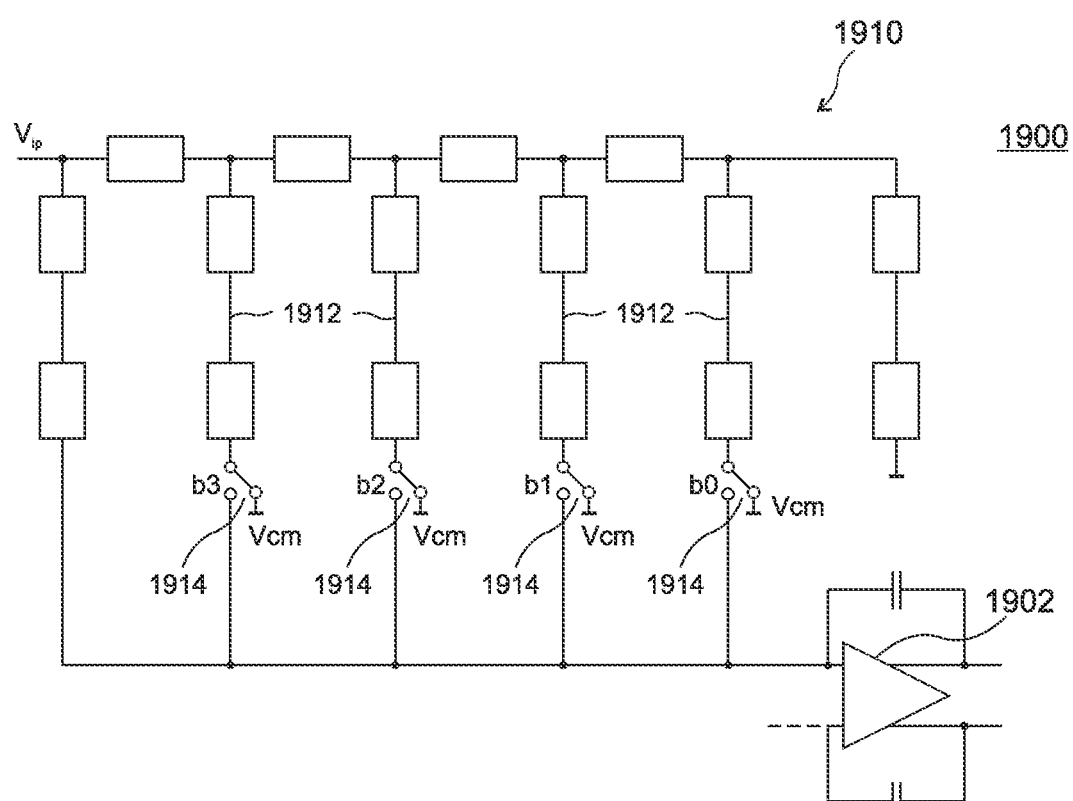

FIGS. 18 and 19 show some examples for resistance tuning. It should be noted that FIGS. 18 and 19 are provided merely as an example, not as a limitation, and the resistor network may be designed differently.

FIG. 187 shows a filter with an example resistor network for resistance tuning. The filter 1800 includes a resistor network 1810 (e.g. a resistor-DAC (R-DAC)) coupled to an input of an active device 1802. The resistor network 1810 includes multiple resistor paths 1812a, 1812b connected in parallel to an input of the active device 1802. The resistor paths 1812a have a resistance value of power of two (e.g. R, 2R, 4R, 8R, . . . ) depending on the weight associated with each resistor path 1712a and each such resistor path 1712a is connected to the input of the active device 1802 via a switch 1814. The resistor network 1810 may include resistor path(s) 1812*b* connected without a switch. The switches 1814 are controlled on/off by a control codeword (in this example, a four-bit codeword). The effective resistance of the resistor network 1810 varies depending on the control codeword as different resistor paths 1812 are coupled depending on the control codeword.

FIG. 19 shows another example of resistance tuning. The filter 1900 includes a resistor network 1910 coupled to an input of an active device 1902. The example resistor network 1910 in FIG. 19 includes an R–2R ladder structure. The input signal is connected to an input of the active device 1902 via the resistor network 1910. The legs 1912 of the R–2R ladder are connected to the input of the active device 1902 via switches 1914 that are controlled on/off by a control codeword (in this example, a four-bit codeword). The effective resistance of the resistor network 1910 varies depending on the control codeword as different 2R legs are coupled depending on the control codeword.

More details and aspects are mentioned in connection with the proposed concept or one or more examples described above or below. Each of the example active filters and ADCs disclosed above with reference with FIGS. 8B-16 may comprise one or more additional features corresponding to one or more aspects of the proposed concept or of one or more examples described above or below (e.g. FIGS. 8B-19).

In some examples, the active filter may be implemented for a second order filter with a single operational amplifier. This topology can avoid a second amplifier that can consume a lot of power. Peaking should be avoided because the filter amplifies the unwanted blocker signals and lowers the dynamic or causes clipping of the filter dynamic range. In the examples, the circuit topology at the input of the active filter can avoid peaking of the signal transfer function.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is an active filter. The active filter includes an active device configured to provide a power gain to an input signal, a feedback network configured to connect an output of the active device to an input of the active device, and an input impedance network configured to couple the input signal to the input of the active device. A combination of the feedback network and the input impedance network is configured to provide frequency response properties of the active filter such that a frequency domain signal transfer function of the active filter has a constant in numerator.

Example 2 is the active filter of example 1, wherein the feedback network includes a parallel resistor-capacitor network coupling an output of the active device to an input of the active device.

Example 3 is the active filer of example 1 or 2, wherein the feedback network includes a series resistor-capacitor network coupling an inverse of the output of the active device to the input of the active device.

Example 4 is the active filter as in any one of examples 1-3, wherein the input impedance network comprises a resistor path coupling the input signal to the input of the active device and a resistor-capacitor path coupled to the resistor path in parallel and coupling an inverse of the input signal to the input of the active device.

Example 5 is the active filter of example 4, wherein the input impedance network has a linear s-polynomial in a numerator of an s-domain impedance of the input impedance network.

Example 6 is the active filter as in any one of examples 1-5, wherein the active device is a differential amplifier and the feedback network includes two parallel resistor-capacitor networks, each coupling one of differential outputs of the active device to a differential input of inverse polarity of the active device, and two series resistor-capacitor networks, each coupling one of the differential outputs of the active device to a differential input of same polarity of the active device.

Example 7 is the active filter of example 6, wherein the input impedance network includes two sets of parallel resistor and resistor-capacitor networks, each set coupling one of differential input signals to differential inputs of the active device.

Example 8 is the active filter of example 6, wherein the input impedance network comprises two sets of parallel resistor-resistor and resistor-capacitor networks, each coupling one of differential input signals to differential inputs of the active device.

Example 9 is the active filter as in any one of examples 1-8, wherein the active device is an operational amplifier or an operational transconductance amplifier.

Example 10 is the active filter as in any one of examples 1-9, wherein a number of active devices in the active filter is smaller than an order of the active filter.

Example 11 is a sigma delta analog-to-digital converter. The sigma delta analog-to-digital converter includes a loop filter, a quantizer, and a digital-to-analog converter. The loop filter includes an active device configured to provide a power gain to an input signal, a feedback network configured to connect an output of the active device to an input of the active device, and an input impedance network configured to couple the input signal to the input of the active device. A combination of the feedback network and the input impedance network is configured to provide frequency response properties of the loop filter such that a frequency domain signal transfer function of the loop filter has a constant in numerator.

Example 12 is the sigma delta analog-to-digital converter of example 11, wherein the feedback network includes a parallel resistor-capacitor network coupling an output of the active device to an input of the active device.

Example 13 is the sigma delta analog-to-digital converter of examples 11 or 12, wherein the feedback network includes a series resistor-capacitor network coupling an inverse of the output of the active device to the input of the active device.

Example 14 is the sigma delta analog-to-digital converter as in any one of examples 11-13, wherein the input impedance network comprises a resistor path coupling the input signal to the input of the active device and a resistor-capacitor path coupled to the resistor path in parallel and coupling an inverse of the input signal to the input of the active device.

Example 15 is the sigma delta analog-to-digital converter of example 14, wherein the input impedance network has a linear s-polynomial in a numerator of an s-domain impedance of the input impedance network.

Example 16 is the sigma delta analog-to-digital converter as in any one of examples 11-15, wherein the active device is a differential amplifier and the feedback network includes two parallel resistor-capacitor networks, each coupling one of differential outputs of the active device to a differential input of opposite polarity of the active device, and two series resistor-capacitor networks, each coupling one of the differential outputs of the active device to a differential input of same polarity of the active device.

Example 17 is the sigma delta analog-to-digital converter of example 16, wherein the input impedance network includes two sets of parallel resistor and resistor-capacitor networks, each set coupling one of differential input signals to differential inputs of the active device.

Example 18 is the sigma delta analog-to-digital converter of example 16, wherein the input impedance network comprises two sets of parallel resistor-resistor and resistor-capacitor networks, each coupling one of differential input signals to differential inputs of the active device.

Example 19 is the sigma delta analog-to-digital converter as in any one of examples 11-18, wherein the active device is an operational amplifier or an operational transconductance amplifier.

Example 20 is the sigma delta analog-to-digital converter as in any one of examples 11-19, wherein a number of active devices in the loop filter is smaller than an order of the loop filter.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An active filter, comprising:
an active device configured to provide a power gain to an input signal;
a feedback network configured to couple an output of the active device to an input of the active device; and an input impedance network configured to couple the input signal to the input of the active device, wherein a combination of the feedback network and the input impedance network is configured to provide frequency response properties of the active filter such that a numerator of a frequency domain signal transfer function of the active filter is a constant, wherein the input impedance network has a linear s-polynomial in a numerator of an s-domain impedance of the input impedance network.

2. The active filter of claim 1, wherein the feedback network includes a parallel resistor-capacitor network coupling an output of the active device to an input of the active device.

3. The active filter of claim 1, wherein the feedback network includes a series resistor-capacitor network coupling an inverse of the output of the active device to the input of the active device.

4. The active filter of claim 1, wherein the input impedance network comprises a resistor path coupling the input signal to the input of the active device and a resistor-capacitor path coupled to the resistor path in parallel and coupling an inverse of the input signal to the input of the active device.

5. The active filter of claim 1, wherein the active device is a differential amplifier and the feedback network includes two parallel resistor-capacitor networks, each coupling one of differential outputs of the active device to a differential input of inverse polarity of the active device, and two series resistor-capacitor networks, each coupling one of the differential outputs of the active device to a differential input of same polarity of the active device.

6. The active filter of claim 5, wherein the input impedance network includes two sets of parallel resistor and resistor-capacitor networks, each set coupling one of differential input signals to differential inputs of the active device.

7. The active filter of claim 5, wherein the input impedance network comprises two sets of parallel resistor-resistor and resistor-capacitor networks, each coupling one of differential input signals to differential inputs of the active device.

8. The active filter of claim 1, wherein the active device is an operational amplifier or an operational transconductance amplifier.

9. The active filter of claim 1, wherein a number of active devices in the active filter is smaller than an order of the active filter.

10. A sigma delta analog-to-digital converter, comprising:
a loop filter;
a quantizer; and
a digital-to-analog converter,
wherein the loop filter comprises:
an active device configured to provide a power gain to an input signal;
a feedback network configured to connect an output of the active device to an input of the active device; and
an input impedance network configured to couple the input signal to the input of the active device,
wherein a combination of the feedback network and the input impedance network is configured to provide frequency response properties of the loop filter such that a numerator of a frequency domain signal transfer function of the loop filter is a constant,
wherein the input impedance network has a linear s-polynomial in a numerator of an s-domain impedance of the input impedance network.

11. The sigma delta analog-to-digital converter of claim 10, wherein the feedback network includes a parallel resistor-capacitor network coupling an output of the active device to an input of the active device.

12. The sigma delta analog-to-digital converter of claim 10, wherein the feedback network includes a series resistor-capacitor network coupling an inverse of the output of the active device to the input of the active device.

13. The sigma delta analog-to-digital converter of claim 10, wherein the input impedance network comprises a resistor path coupling the input signal to the input of the active device and a resistor-capacitor path coupled to the resistor path in parallel and coupling an inverse of the input signal to the input of the active device.

14. The sigma delta analog-to-digital converter of claim 10, wherein the active device is a differential amplifier and the feedback network includes two parallel resistor-capacitor networks, each coupling one of differential outputs of the active device to a differential input of opposite polarity of the active device, and two series resistor-capacitor networks, each coupling one of the differential outputs of the active device to a differential input of same polarity of the active device.

15. The sigma delta analog-to-digital converter of claim 14, wherein the input impedance network includes two sets of parallel resistor and resistor-capacitor networks, each set coupling one of differential input signals to differential inputs of the active device.

16. The sigma delta analog-to-digital converter of claim 14, wherein the input impedance network comprises two sets of parallel resistor-resistor and resistor-capacitor networks, each coupling one of differential input signals to differential inputs of the active device.

17. The sigma delta analog-to-digital converter of claim 10, wherein the active device is an operational amplifier or an operational transconductance amplifier.

18. The sigma delta analog-to-digital converter of claim 10, wherein a number of active devices in the loop filter is smaller than an order of the loop filter.

* * * * *